(12) United States Patent
Yang et al.

(10) Patent No.: US 9,800,371 B2
(45) Date of Patent: Oct. 24, 2017

(54) METHOD FOR TRANSMITTING AND RECEIVING PACKETS IN COMMUNICATION SYSTEM USING ERROR CORRECTION CODE

(71) Applicant: Samsung Electronics Co., Ltd., Suwon-si, Gyeonggi-do (KR)

(72) Inventors: Hyun-Koo Yang, Seoul (KR); Sung-Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/031,111

(22) PCT Filed: Oct. 22, 2014

(86) PCT No.: PCT/KR2014/009976
§ 371 (c)(1),
(2) Date: Apr. 21, 2016

(87) PCT Pub. No.: WO2015/060653
PCT Pub. Date: Apr. 30, 2015

(65) Prior Publication Data
US 2016/0241356 A1 Aug. 18, 2016

(30) Foreign Application Priority Data

Oct. 22, 2013 (KR) .................. 10-2013-0126248

(51) Int. Cl.
*H03M 13/00* (2006.01)
*H04L 1/00* (2006.01)
(Continued)

(52) U.S. Cl.
CPC .......... *H04L 1/0041* (2013.01); *H03M 13/05* (2013.01); *H03M 13/2707* (2013.01);
(Continued)

(58) Field of Classification Search
CPC ....... H04L 1/0041; H04L 1/00; H04L 1/0045; H03M 13/05; H03M 13/2707; H03M 13/6356
See application file for complete search history.

(56) References Cited

U.S. PATENT DOCUMENTS 6,278,716 B1 * 8/2001 Rubenstein ........... H04L 1/1819
370/394
7,418,651 B2 * 8/2008 Luby ..................... H03M 13/29
714/800
(Continued)

FOREIGN PATENT DOCUMENTS

KR 10-2010-0100655 A 9/2010
KR 10-2012-0062125 A 6/2012
(Continued)

*Primary Examiner* — Esaw Abraham
(74) *Attorney, Agent, or Firm* — Jefferson IP Law, LLP

(57) ABSTRACT

A method by which a signal transmission device transmits packets in a communication system is provided. The method includes the operations of, generating a source symbol block including one or more source symbols having the same length by using a source packet block including one or more source packets; generating a restoration symbol block generated using one or more restoration symbols by performing a forward error correction (FEC) coding operation on the source symbol block; generating an FEC source packet including the source packets and an FEC payload identifier (ID) and transmitting the FEC source packet to a lower protocol; generating an FEC restoration packet including one or more of the restoration symbols and the FEC payload ID and transmitting the FEC restoration packet to the lower protocol; and transmitting FEC configuration information including information on the source symbol block generation operation to a receiver.

13 Claims, 12 Drawing Sheets

(51) Int. Cl.
*H03M 13/05*      (2006.01)
*H03M 13/27*      (2006.01)

(52) U.S. Cl.
CPC .......... *H03M 13/6356* (2013.01); *H04L 1/00* (2013.01); *H04L 1/0045* (2013.01)

(56) References Cited

U.S. PATENT DOCUMENTS

| | | | | |
|---|---|---|---|---|
| 7,617,436 | B2 * | 11/2009 | Wenger | H04N 19/147 |
| | | | | 714/758 |
| 8,065,582 | B2 * | 11/2011 | Watson | H03M 13/373 |
| | | | | 714/752 |
| 8,787,153 | B2 * | 7/2014 | Begen | H04L 1/0009 |
| | | | | 370/225 |
| 8,904,262 | B2 * | 12/2014 | Diener | H04L 1/0017 |
| | | | | 714/776 |
| 9,191,151 | B2 * | 11/2015 | Luby | H04N 21/23106 |
| 9,312,989 | B2 * | 4/2016 | Begen | G06F 11/1443 |
| 2012/0144265 | A1 | 6/2012 | Hwang et al. | |
| 2012/0170596 | A1 | 7/2012 | Hwang et al. | |
| 2013/0013982 | A1 | 1/2013 | Hwang et al. | |

FOREIGN PATENT DOCUMENTS

| | | |
|---|---|---|
| KR | 10-2012-0079209 A | 7/2012 |
| KR | 10-2012-0137203 A | 12/2012 |
| KR | 10-2013-0006380 A | 1/2013 |

\* cited by examiner

▨ Octet Representing Length of Corresponding Source Packet
▩ Padding Byte (Zero Octet)

METHOD FOR TRANSMITTING AND RECEIVING PACKETS IN COMMUNICATION SYSTEM USING ERROR CORRECTION CODE

CROSS-REFERENCE TO RELATED APPLICATION(S)

This application is a U.S. National Stage application under 35 U.S.C. §371 of an International application filed on Oct. 22, 2014 and assigned application number PCT/KR2014/009976, which claimed the benefit of a Korean patent application filed on Oct. 22, 2013 in the Korean Intellectual Property Office and assigned Serial number 10-2013-0126248, the entire disclosure of which is hereby incorporated by reference.

TECHNICAL FIELD

The present disclosure relates to a scheme for transmitting/receiving a packet in a communication system. More particularly, the present disclosure relates to an apparatus and method for efficiently recovering a lost packet by using an error correction code.

BACKGROUND

In recent communication systems, with changes in content consumption tendencies and increases in high-volume contents such as high definition (HD) and ultra-HD (UHD) contents, data congestion on networks has become serious. Due to such situations, contents transmitted by a signal transmitter (e.g., a host A) may not be normally delivered to a signal receiver (e.g., a host B), and the entire contents transmitted by the signal transmitter or a part thereof may be lost on a route.

Since data is generally transmitted on a packet basis, a packet-based data loss occurs. If a transmission packet is lost on a network as a result, the signal receiver may fail to receive the lost transmission packet and thus may not be aware of data included in the lost transmission packet. Consequently, various inconveniences such as audio quality degradation, video quality deterioration or screen distortion, subtitle omission, a file loss, and so forth may be caused to users. For this reason, a technique for recovering a data loss occurring on a network is needed.

As a supporting technique for recovering data lost on a network by a receiver, there is a technique for configuring a source packet block with a predetermined number of data packets, called source packets, having various lengths and adding recovery information such as parity data or a repair packet to the source packet block. If there is a lost packet, the receiver may perform decoding by using the recovery information.

The above information is presented as background information only to assist with an understanding of the present disclosure. No determination has been made, and no assertion is made, as to whether any of the above might be applicable as prior art with regard to the present disclosure.

SUMMARY

A process of generating parity data or a repair packet from a source packet block through forward error correction (FEC) coding includes configuring a source symbol block including source symbols having the same length from the source packet block, generating a repair symbol block including repair symbols by using FEC encoding, converting the generated repair symbol blocks into FEC repair packets for transmission, and transmitting the FEC repair packets together with FEC source packets, which are source packets after FEC encoding, through an FEC packet. Each of the source packets may have a variable length and a source symbol block includes source symbols having the same length, such that padding data is needed when the source symbol block is generated from the source packet block. Thus, to repair a lost source packet by using a recovered source symbol block, it is necessary to erase the padding data.

In particular, even when the source symbol block is partially recovered without being completely recovered, a need exists for a method for repairing as many source packets as possible.

Aspects of the present disclosure are to address at least the above-mentioned problems and/or disadvantages and to provide at least the advantages described below. Accordingly, an aspect of the present disclosure is to provide a method and apparatus for transmitting/receiving a packet in a communication system.

Another aspect of the present disclosure is to provide a packet transmission/reception method and apparatus which increases the efficiency of data recovery in a communication system.

Another aspect of the present disclosure is to provide a packet transmission/reception method and apparatus which acquires efficient transmission reliability in a communication system.

Another aspect of the present disclosure is to provide a transmission/reception method and apparatus which finds out a start point of a lost packet in a recovered source symbol of a completely or partially recovered source block when a header of a source packet includes information about a length of the source packet in a communication system.

Another aspect of the present disclosure is to provide a transmission/reception method and apparatus which finds out a start point of a lost packet in a recovered source symbol of a completely or partially recovered source block when a header of a source packet does not include information about a length of the source packet in a communication system.

Another aspect of the present disclosure is to provide a transmission/reception method and apparatus which erases padding data from a recovered source symbol of a completely or partially recovered source block in a communication system.

Another aspect of the present disclosure is to provide a transmission/reception method and apparatus which repairs all source packets included in a recovered source symbol of a completely or partially recovered source block in a communication system.

In accordance with an aspect of the present disclosure, a method for transmitting a packet by a signal transmission device in a communication system is provided. The method includes generating a source symbol block including one or more source symbols having an identical length by using a source packet block including one or more source packets, generating a repair symbol block including one or more repair symbol blocks by performing FEC encoding with respect to the source symbol block, generating an FEC source packet including the source packets and an FEC payload identifier (ID) and delivering the FEC source packet to a lower protocol, generating an FEC repair packet including the one or more repair symbols and an FEC payload ID and delivering the FEC repair packet to a lower protocol, and delivering FEC configuration information including information about the generation of the source symbol block to a receiver.

When one source packet is mapped to one source symbol in the generation of the source symbol block, the source symbol includes the source packet and information indicating a length of the source packet, and when necessary, padding bytes.

In accordance with another aspect of the present disclosure, a method for transmitting a packet by a signal transmission device in a communication system is provided. The method includes generating a source symbol block including one or more source symbols having an identical length by using a source packet block including one or more source packets, generating a repair symbol block including one or more repair symbol blocks by performing FEC encoding with respect to the source symbol block, generating an FEC source packet including the source packets and an FEC payload ID and delivering the FEC source packet to a lower protocol, generating an FEC repair packet including the one or more repair symbols and an FEC payload ID and delivering the FEC repair packet to a lower protocol, and delivering FEC configuration information including information about the generation of the source symbol block to a receiver, in which the symbol element includes a symbol element header and the entire source packet or a part thereof, and when necessary, padding bytes, and the symbol element header includes information indicating whether the symbol element including the symbol element header includes a start portion of the source packet, information indicating whether the symbol element including the symbol element header includes a last portion of the source packet, and when necessary, information indicating a length of padding bytes included in the symbol element including the symbol element header.

In accordance with another aspect of the present disclosure, a method for transmitting a packet by a signal transmission device in a communication system is provided. The method includes generating a source symbol block including one or more source symbols having an identical length by using a source packet block including one or more source packets, generating a repair symbol block including one or more repair symbol blocks by performing FEC encoding with respect to the source symbol block, generating an FEC source packet including the source packets and an FEC payload ID and delivering the FEC source packet to a lower protocol, generating an FEC repair packet including the one or more repair symbols and an FEC payload ID and delivering the FEC repair packet to a lower protocol, and delivering FEC configuration information including information about the generation of the source symbol block to a receiver, in which a header of the source packet includes information indicating a length of the source packet, one source symbol includes one or more symbol elements in the generation of the source symbol block, the symbol element includes a symbol element header and the entire source packet or a part thereof and when necessary, padding bytes, and the symbol element header includes information indicating whether the symbol element including the symbol element header includes a start portion of the source packet.

In accordance with another aspect of the present disclosure, a signal transmission device for transmitting a packet in a communication system is provided. The signal transmission device includes a source symbol block generator configured to generate a source symbol block including one or more source symbols having an identical length by using a source packet block including one or more source packets, an FEC encoder configured to generate a repair symbol block including one or more repair symbol blocks by performing FEC encoding with respect to the source symbol block, an FEC packet generator configured to deliver an FEC source packet including the source packets and an FEC payload ID to a lower protocol and to generate an FEC repair packet including the one or more repair symbols and an FEC payload ID and deliver the FEC repair packet to a lower protocol, and an FEC signal delivering unit configured to deliver FEC configuration information including information about the generation of the source symbol block to a receiver. When one source packet is mapped to one source symbol in the source symbol block generator, the source symbol includes the source packet and information indicating a length of the source packet, and when necessary, padding bytes.

In accordance with another aspect of the present disclosure, a signal transmission device for transmitting a packet in a communication system is provided. The signal transmission device includes a source symbol block generator configured to generate a source symbol block including one or more source symbols having an identical length by using a source packet block including one or more source packets, an FEC encoder configured to generate a repair symbol block including one or more repair symbol blocks by performing FEC encoding with respect to the source symbol block, an FEC packet generator configured to deliver an FEC source packet including the source packets and an FEC payload ID to a lower protocol and to generate an FEC repair packet including the one or more repair symbols and an FEC payload ID and deliver the FEC repair packet to a lower protocol, and an FEC signal delivering unit configured to deliver FEC configuration information including information about the generation of the source symbol block to a receiver, in which the source symbol block generator configures one source symbol with one or more symbol elements, the symbol element includes a symbol element header and the entire source packet or a part thereof, and when necessary, padding bytes, and the symbol element header includes information indicating whether the symbol element including the symbol element header includes a start portion of the source packet, information indicating whether the symbol element including the symbol element header includes a last portion of the source packet, and information indicating a length of padding bytes included in the symbol element including the symbol element header.

In accordance with another aspect of the present disclosure, a signal transmission device for transmitting a packet in a communication system is provided. The signal transmission device includes a source symbol block generator configured to generate a source symbol block including one or more source symbols having an identical length by using a source packet block including one or more source packets, an FEC encoder configured to generate a repair symbol block including one or more repair symbol blocks by performing FEC encoding with respect to the source symbol block, an FEC packet generator configured to deliver an FEC source packet including the source packets and an FEC payload ID to a lower protocol and to generate an FEC repair packet including the one or more repair symbols and an FEC payload ID and deliver the FEC repair packet to a lower protocol, and an FEC signal delivering unit configured to deliver FEC configuration information including information about the generation of the source symbol block to a receiver, in which a header of the source packet includes information indicating a length of the source packet, the source symbol block generator configures one source symbol with one or more symbol elements, the symbol element includes a symbol element header and the entire source packet or a part thereof and when necessary, padding bytes, and the symbol element header includes information indicating whether the symbol element including the symbol element header includes a start portion of the source packet.

In accordance with another aspect of the present disclosure, a method for receiving a packet by a signal reception device in a communication system is provided. The method includes receiving a signal from a transmitter and demodulating a packet, selecting a packet including FEC configuration information from the received packet and obtaining the FEC configuration information, obtaining a source packet and an FEC payload ID from an FEC source packet of the received packet, obtaining a repair symbol and an FEC payload ID from an FEC repair packet of the received packet, generating a received encoding block including a received source symbol block by using the obtained source packet, the obtained repair symbol, the obtained FEC payload ID, and the obtained FEC configuration information, generating a recovered encoding block by applying FEC decoding to the received encoding block, extracting a source packet from a recovered source symbol of the recovered encoding block, and delivering the extracted source packet to an upper protocol, in which the extraction of the source packet includes determining whether the recovered symbol element includes a start portion of a lost source packet, whether the recovered symbol element includes a last portion of the lost source packet, and the number of padding bytes included in the recovered symbol element, by using information included in the recovered symbol element in the extraction of the source packet, and erasing padding bytes from one or more recovered symbol elements by using a result of the determination and extracting source packets included in the recovered symbol element.

In accordance with another aspect of the present disclosure, a signal reception device for receiving a packet in a communication system is provided. The signal reception device includes a demodulator configured to receive a signal from a transmitter and to demodulate a packet, an FEC configuration information obtaining unit configured to select a packet including FEC configuration information from the received packet and to obtain the FEC configuration information, an FEC packet receiver configured to obtain a source packet and an FEC payload ID from an FEC source packet of the received packet and to obtain a repair symbol and an FEC payload ID from an FEC repair packet of the received packet, a received encoding block generator configured to generate a received encoding block including a received source symbol block by using the obtained source packet, the obtained repair symbol, the obtained FEC payload ID, and the obtained FEC configuration information, an FEC decoder configured to generate a recovered encoding block by applying FEC decoding to the received encoding block, a repair packet extractor configured to extract a source packet from a recovered source symbol of the recovered encoding block, and a packet delivering unit configured to deliver the extracted source packet to an upper protocol, wherein the repair packet extractor determines whether the recovered symbol element includes a start portion of a lost source packet, whether the recovered symbol element includes a last portion of the lost source packet, and the number of padding bytes included in the recovered symbol element, by using information included in the recovered symbol element in the extraction of the source packet, and erases padding bytes from one or more recovered symbol elements by using a result of the determination and extracts source packets included in the recovered symbol element.

An efficient packet transmission and reception apparatus and method in a broadcast/communication system according to an embodiment of the present disclosure may be provided.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
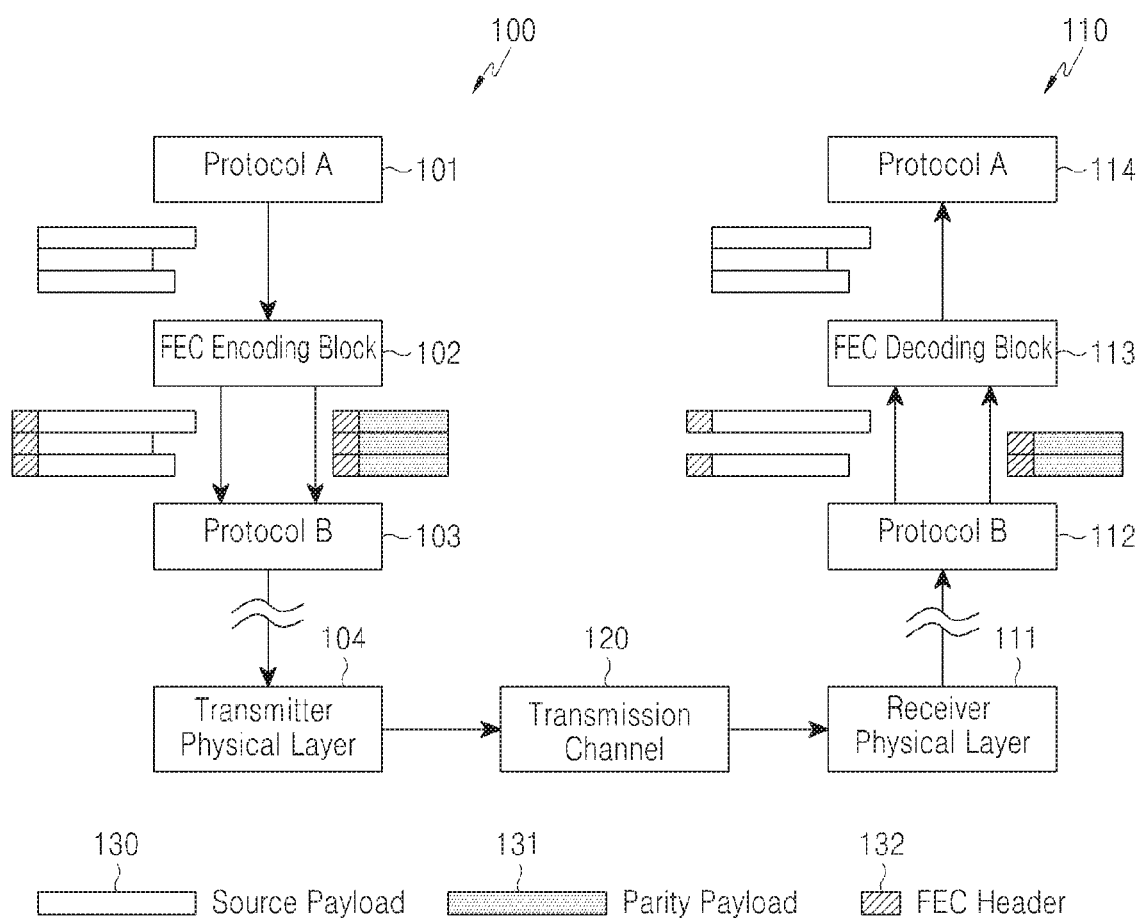
FIG. 1 is a block diagram of a transmitter and a receiver using a high-layer error correction code according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In a description of the present disclosure, a communication system is assumed to be, for example, a moving picture experts group (MPEG) media transport (MMT) system, and may also be a communication system such as an evolved packet system (EPS), a long term evolution (LTE) mobile communication system, and an LTE-advanced (LTE-A) mobile communication system, and the Institute of Electrical and Electronics Engineers (IEEE) 802.16m communication system, or the like, as well as the MMT system.

Meanwhile, embodiments of the present disclosure to be described below propose a packet transmission/reception apparatus and method for efficiently recovering a loss of a data packet in any electronic devices such as cellular phones, televisions (TVs), computers, electronic boards, tablet personal computers (PCs), electronic books, and so forth that are capable of various multimedia services such as video conference/communication and so forth as well as high-volume contents such as high-definition (HD) contents, ultra-HD (UHD) contents, and the like over a network.

It should be noted that although a detailed forward error correction (FEC) coding scheme will not be described in the various embodiments of the present disclosure, the FEC encoding scheme is not limited to a particular FEC encoding scheme such as a reed-solomon (RS) code, a low density parity check (LDPC) code, a turbo code, a raptor code, XOR, Pro-MPEG FEC code, or the like.

Hereinafter, terms to be used in the description of the various embodiments of the present disclosure will be defined.

FEC Code: an error correction code to correct an error symbol or an erasure symbol Source Symbol: a unit of data used during a FEC encoding process Repair Symbol: an encoding symbol that is not a source symbol Source Packet: a packet protected by an FEC encoding scheme Source Packet Block: a segmented set of source packets of FEC source flow that are to be protected as a single block Source Symbol Block: a set of source symbols generated from a single source packet block Repair Symbol Block: a set of repair symbols which can be used to recover lost source symbols Encoding Symbol Block: a set of encoding symbols from the encoding process of a source symbol block Encoding Symbol: a unit of data generated by an encoding process, in which source symbols are part of the encoding symbols)

FEC Repair Packet: a packet along with a repair FEC payload identifier (ID) to deliver one or more repair symbols of a repair symbol block FEC Source Packet: a source packet along with a source FEC payload ID FEC Source or Repair Packet: an error correction repair packet or an error correction source packet FEC Source Packet Block: a set of error correction source packets for transmission of a source symbol block FEC Repair Packet Block: a set of error correction parity (recovery) packets for transmission of a repair symbol block FEC Source or Repair Packet Block: an error correction source packet block and its associated error correction repair packet block, that is, a set of error correction source or repair packets for transmission of an encoding symbol block FEC Payload ID: an identifier that identifies the contents of an MMT packet with respect to the MMT FEC scheme Repair FEC Payload ID: an FEC payload ID specifically for use with repair packets Source FEC Payload ID: an FEC payload ID specifically for use with source packets MMT (MPEG media transport): the International standard being designed for efficient transmission of MPEG data FEC Source Flow: a flow of source packets protected by a single instance of an MMT FEC scheme FEC Scheme: a specification that defines the additional protocol aspects required to use FEC codes FEC Code: an algorithm for encoding data such that the encoded data flow is resilient to a data loss FEC Parity (Repair) Flow: a data flow carrying repair symbols to protect a source flow FEC Encoded Flow: a logical set of flows that consists of an FEC source flow and its associated one or more FEC repair flows Asset: a data entity containing data with the same transport characteristics and that is composed of one of more media processing units (MPUs) with same Asset ID MPU: a generic container for independently decodable timed or non-timed data, that is media codec agnostic Package: a logical collection of data, which is composed of one or more Assets and their related Asset Delivery Characteristics, and a Composition Information MMT Packet: a formatted unit of data generated or consumed according to the MMT protocol MMT Payload: a formatted unit of data to carry the Package or signaling message either using MMT protocol or Internet application layer transport protocols (e.g. real-time transport protocol (RTP))

MMT Protocol (MMTP): an application layer transport protocol for delivering MMT payload over an Internet protocol (IP) network Hereinafter, a structure of a communication system according to an embodiment of the present disclosure will be described with reference to FIG. 1.

FIG. 1 is a block diagram of a transmitter and a receiver using a high-layer ECC according to an embodiment of the present disclosure.

Referring to FIG. 1, a transmitter 100 may include a protocol A block 101 corresponding to an FEC upper protocol, an FEC encoding block 102, a protocol B block 103 corresponding to an FEC lower protocol, and a transmitter physical layer block 104.

The protocol A block 101 configures transmission data in the form of a source packet including a source payload 130 for delivery to the FEC encoding block 102.

The FEC encoding block 102 configures a source packet block, which is a set of source packets, performs FEC encoding to generate parity symbols including a parity payload 131, and adds an FEC header 132 to the source packet and the parity symbol for delivery to the protocol B block 103.

The source packet combined with the FEC header is called an FEC source packet, and the parity symbol combined with the FEC header is called an FEC parity packet. Referring to FIG. 1, the FEC source packet is a data unit in which the FEC header and the source payload are sequentially combined, but in some implementation, the FEC source packet may be a data unit in which the FEC header is sequentially combined after the source payload.

Referring to FIG. 1, the FEC encoding block 102 is positioned between the protocol A block 101 and the protocol B block 103, but in some implementation, the protocol A block 101 may include the FEC encoding block 102. In this case, a protocol header for performing a function of the protocol A block 101 may be included in the FEC parity packet, and the protocol A block including the FEC encoding block may include a multiplexer for making the source packet and the parity packet into one packet flow.

The transmitter physical layer block 104 converts the FEC source packet and the FEC parity (repair) packet into a signal suitable for transmission and transmits the signal. Various layers may exist between the protocol B block 103 and the transmitter physical layer block 104, and a detailed structure thereof is not related to the subject matter of the present disclosure and thus will be omitted.

A receiver 110 may include a receiver physical layer block 111, a protocol B block 112 corresponding to an FEC lower protocol, an FEC decoding block 113, and a protocol A block 114 corresponding to an FEC upper protocol.

The receiver physical layer block 111 interprets a signal received through a transmission channel 120, and delivers the signal to the protocol B block 112. Similarity with the transmitter 100, various layers may exist between the protocol B block 112 and the receiver physical layer block 111, and a detailed structure thereof is not related to the subject matter of the present disclosure and thus will be omitted.

The protocol B block 112 interprets the received signal or packet and delivers received FEC packets to the FEC decoding block 113. Some of FEC packets transmitted by the transmitter may not be delivered to the FEC decoding block 113 by being lost due to an influence of network congestion or an error occurring in the physical layer.

The FEC decoding block 113 performs FEC decoding with respect to a delivered FEC packet to recover lost source packets and delivers the source packets to the upper protocol A block 114 together with the received packets. The FEC header refers to an FEC payload ID, an FEC header for an FEC source packet is a source FEC payload ID, and an FEC header for an FEC parity packet is a repair FEC payload ID. When the present disclosure is applied to an MMT system, the source packet is an MMT packet, the FEC source packet is an MMT packet having a source FEC payload ID, and the FEC parity (repair) packet is an MMT packet having a repair FEC payload ID carrying a parity (repair) symbol.

Figure 2:
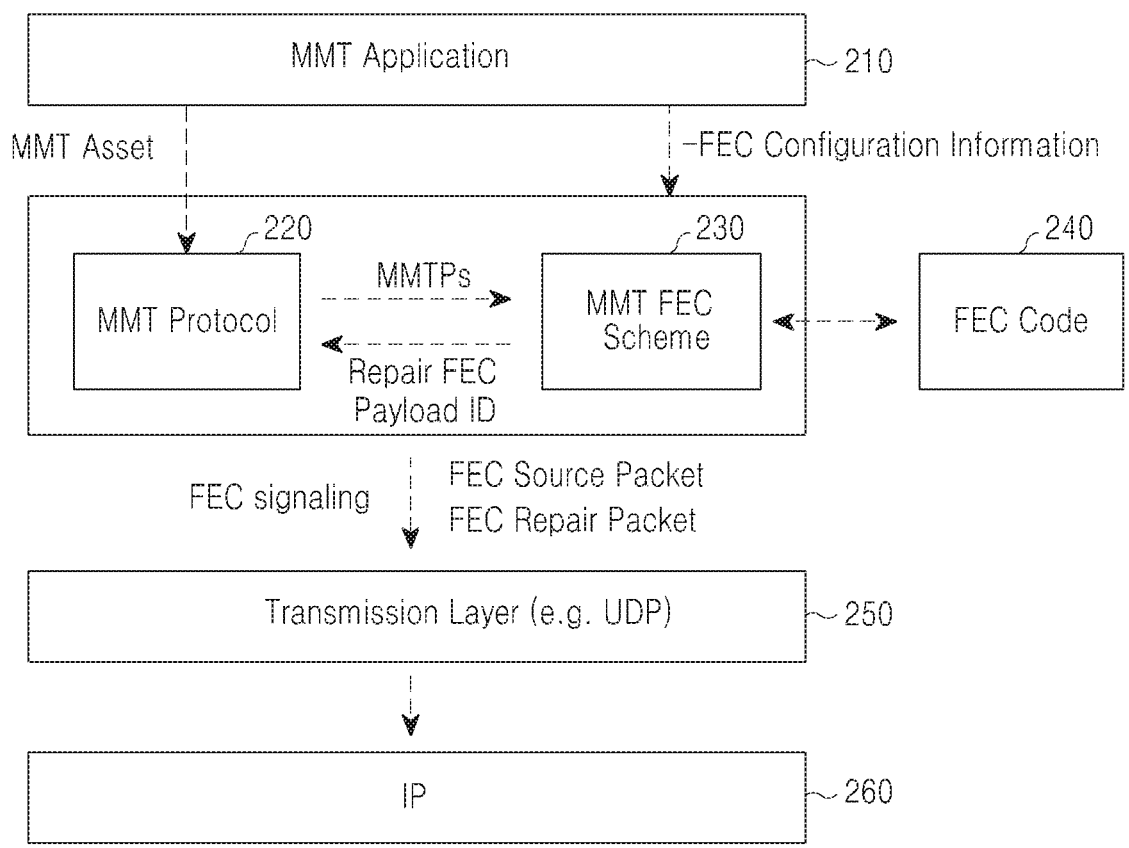
FIG. 2 schematically shows an application layer-forward error correction (AL-FEC) architecture of a moving picture experts group (MPEG) media transport (MMT) system according to an embodiment of the present disclosure.

FIG. 2 illustrates an application layer-FEC (AL-FEC) architecture in an MMT system according to an embodiment of the present disclosure.

Referring to FIG. 2, an MMT application 210 determines MMT assets to be transmitted with protection through an AL-FEC and inputs the determined MMT assets to an MMT protocol 220. The MMT application 210 inputs AL-FEC configuration information to an MMT FEC scheme 230.

The MMT protocol 220 packetizes input assets into MMT payloads, adds an MMT packet header thereto to generate a source packet, and inputs source packets to an MMT FEC scheme 230 in the unit of source packet blocks including a predetermined number of source packets.

The MMT FEC scheme 230 generates a source symbol block from respective input source packet blocks according to a source symbol block generation method given based on FEC configuration information input from the MMT application 210. The source symbol block generation method according to an embodiment of the present disclosure is given based on FEC configuration information, and the MMT FEC scheme 230 generates a source symbol block according to an embodiment of the present disclosure if the source symbol block generation method according to an embodiment of the present disclosure is specified in the FEC configuration information.

The FEC configuration information is delivered to the receiver through an MMT packet having a separate format or to a separate protocol.

The MMT FEC scheme 230 generating the source symbol block inputs the source symbol block to an FEC code 240 which then generates a repair symbol block from the input source symbol block and inputs the repair symbol block to the MMT FEC scheme 230. The MMT FEC scheme 230 generates an FEC payload ID for the source symbol block and the repair symbol block, and inputs repair symbols received from the FEC code 240 to the MMT protocol 220.

The MMT protocol 220 generates an FEC source packet or an FEC repair packet by using the input repair symbols and FEC payload ID. More specifically, the MMT protocol 220 adds a source FEC payload ID to a source packet to generate an FEC source packet, adds a repair FEC payload ID, an MMT payload header, and an MMT packet header to a repair symbol to generate an FEC repair packet, and transmits the FEC source packet and the FEC repair packet to an IP 260 through a transport layer 250 such as a user datagram protocol (UDP).

To facilitate a description, it has been described that FEC source packets are generated and FEC parity (repair) packets are generated and transmitted in the unit of source packet blocks. However, in an actual network environment, the MMT protocol 220 may inputs a generated source packet to the MMT FEC scheme 230 and at the same time, add a source FEC payload ID to a generated source packet to generate and transmit an FEC source packet, and the MMT FEC scheme 230 stores the source packet in an internal memory and, upon receiving the last source packet for a source packet block, generates a source symbol block from the source packet block to cause the FEC code 240 to generate a parity symbol block, and inputs the generated parity symbol block to the MMT protocol 220 together with the FEC payload ID to generate and transmit FEC parity (repair) packets.

The source FEC payload ID indicates information for specifying a source symbol block generated to protect a source packet including the source FEC payload ID and source symbols to which the source packet is mapped in the source symbol block. There may be various representation methods for delivering the information and these methods are not related to the subject matter of the present disclosure. Therefore, in the present disclosure, a detailed description of a source FEC payload will be omitted, and it is assumed that if a source packet is received thereafter, to which source symbol of which source symbol block the received source packet is mapped may be known.

In a communication system according to an embodiment of the present disclosure, information indicating a length of the source packet is not included in a header of a source packet, and an FEC scheme selects one of the following source symbol generation methods to configure a source symbol block and to perform FEC encoding. The FEC configuration information and the FEC payload ID includes information needed for the receiver to implement a used source symbol generation method, in which the information includes information indicating the used source symbol generation method and information indicating the length of the repair symbol.

Figure 3:
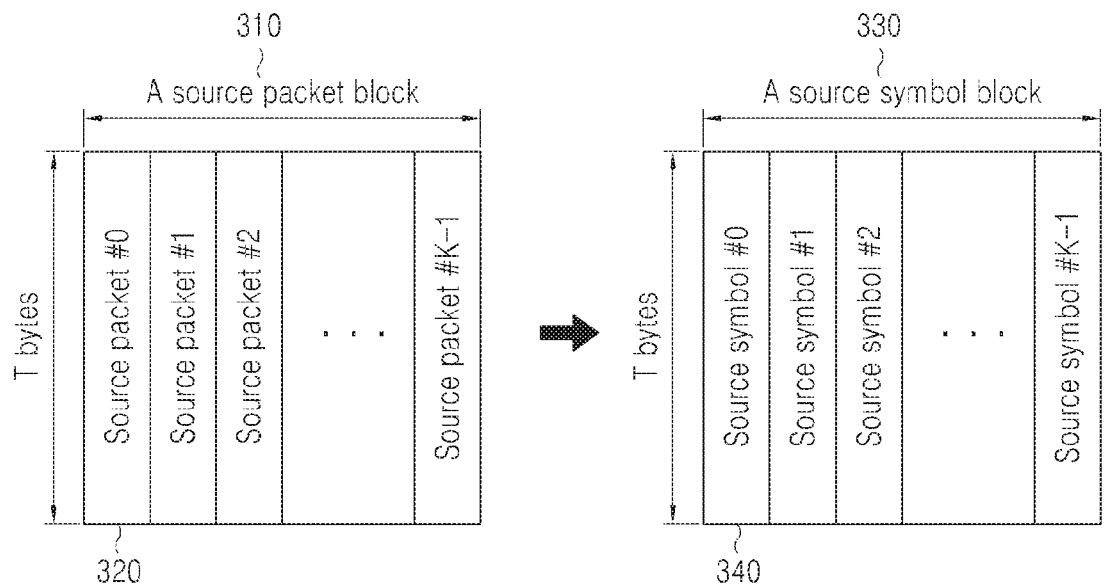
FIG. 3 shows a source symbol block generation method according to an embodiment of the present disclosure.

FIG. 3 illustrates a source symbol block generation method according to an embodiment of the present disclosure.

Referring to FIG. 3, a source packet block 310 including K source packets 320 having an identical length of T bytes is converted into a source symbol block 330 including K source symbols 340 having an identical length of T bytes. In this case, an $i^{th}$ source symbol (0<=i<K) is identical to an $i^{th}$ source packet. The length of the source packet 320 and the length of the source symbol 340, T bytes, may be delivered to the receiver through the FEC configuration information.

Hereinbelow, the source block generation method illustrated in FIG. 3 will be referred to as ssbg_mode0. To use ssbg_mode0, the length of every source packet 320 included in the source packet block 310 has to be identical.

Figure 4:
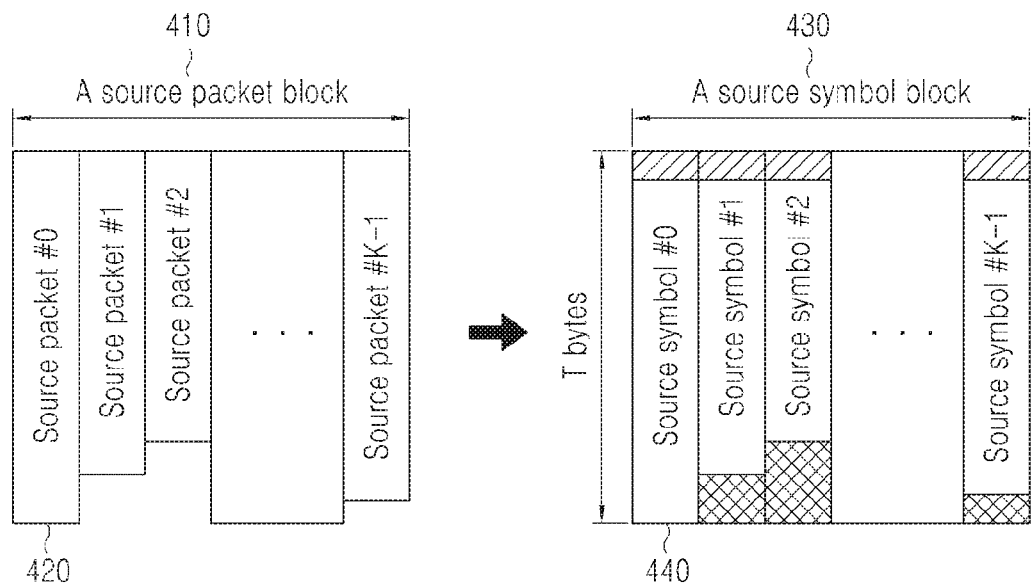
FIG. 4 shows another source symbol block generation method according to an embodiment of the present disclosure.

FIG. 4 illustrates another source symbol block generation method according to an embodiment of the present disclosure.

Referring to FIG. 4, a region marked with unidirectional diagonal lines indicates octets representing the length of a corresponding source packet, and a region marked with bidirectional diagonal lines indicates padding bytes (i.e., zero octets).

Referring to FIG. 4, a source packet block 410 including K source packets 420 is converted into a source symbol block 430 including K source symbols 440 having an identical length of T bytes. The $i^{th}$ source symbol (0<=i<K) includes information indicating a length of the $i^{th}$ source packet and the $i^{th}$ source packet, and bytes following the information and the $i^{th}$ source packet are padded by particular values. The bytes padded by the particular values will be referred to as padding bytes. The length of the source symbol 340, T bytes, may be delivered to the receiver through the FEC configuration information.

Hereinbelow, the source block generation method illustrated in FIG. 4 will be referred to as 'ssbg_mode1'. If the value T is set to be less than and equal to 65535(=$2^{16}$-1), ssbg_mode1 is described as follows. Let octets representing an $i^{th}$ source packet to be mapped to the source symbol block be 430 R[i], a length of R[i] calculated in byte units be S[i], two octets expressing S[i] be L[i], and T−2−S[i] padding bytes (zero octets) be P[i]. The $i^{th}$ source symbol 440 of the source symbol block 430 is configured by sequentially connecting L[i], R[i], and then P[i]. The value T is transmitted in a field having a length of 2 bytes through the FEC configuration information.

To use ssbg_mode1, the maximum length of the source packet 420 included in the source packet block 410 has to be equal to or less than (T−2) bytes. It is apparent that even if L[i] is configured with two octets representing a byte-based length of P[i], a desired function of the present disclosure may be performed identically. If the maximum value of the value T is a value different from 65535 (e.g., a value greater than 65535), only the lengths of L[i] and P[i] may be adjusted based on the number of bytes for expressing the value T in the foregoing embodiment.

If information indicating the length of the source packet is included in the header of the source packet 420, the $i^{th}$ source symbol 440 of the source symbol block 430 generated using ssbg_mode1 is configured by sequentially connecting R[i] and P[i]. Herein, P[i] indicates (T−S[i]) zero octets (i.e., padding bytes), and S[i] may be obtained in the source packet header.

Figure 5:
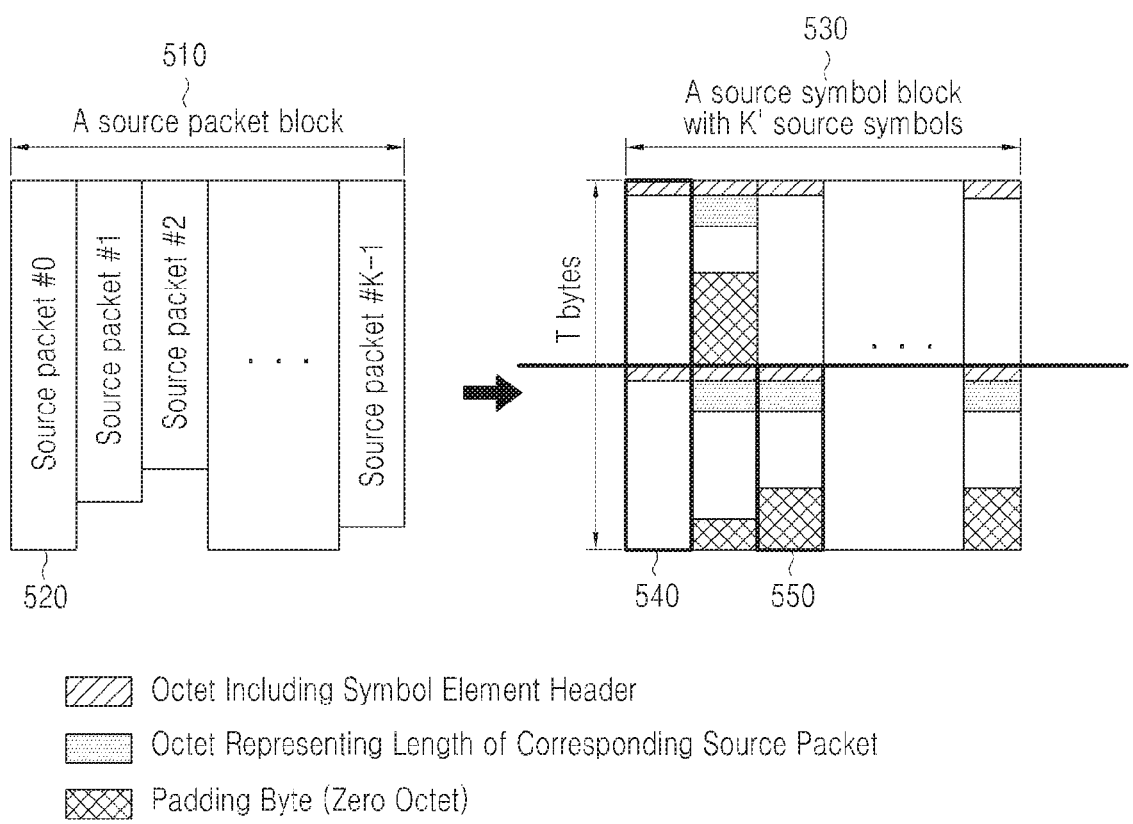
FIG. 5 shows another source symbol block generation method according to an embodiment of the present disclosure.

FIG. 5 illustrates a source symbol block generation method according to an embodiment of the present disclosure.

Referring to FIG. 5, a region marked with unidirectional diagonal lines indicates octets containing a symbol element header, a region filled with multiple points indicates octets representing the length of a corresponding source packet, and a region marked with bidirectional diagonal lines represents padding bytes (i.e., zero octets).

Referring to FIG. 5, a source packet block 510 including K source packets 520 is converted into a source symbol block 530 including K' source symbols 540 having an identical length of T bytes. Every source symbol 540 included in the source symbol block 530 includes N (N>0) symbol elements 550. Thus, the source symbol block 530 includes N*K' symbol elements 550. Referring to FIG. 5, N=2, for example. The length of the source symbol 340, T bytes, and the number of symbol elements 550 of the source symbol 540, N, may be delivered to the receiver through the FEC configuration information. Hereinbelow, the source block generation method illustrated in FIG. 5 will be referred to as 'ssbg_mode 2'.

For convenience, it is assumed that the entire $i^{th}$ source packet or a part thereof is mapped to a $j^{th}$ symbol element. The $j^{th}$ symbol element includes a symbol element header and the entire $i^{th}$ source packet mapped to the $j^{th}$ symbol element or a part of the $i^{th}$ source packet, and include padding bytes when necessary.

In an embodiment of the present disclosure, the symbol element header may include at least one of information indicating whether the $j^{th}$ symbol element includes a start portion of the $i^{th}$ source packet, information indicating whether the $j^{th}$ symbol element includes the last portion of the $i^{th}$ source packet, and information indicating a length of effective information included in the $j^{th}$ symbol element (i.e., a length of the entire $i^{th}$ source packet included in the $j^{th}$ symbol element or a length of a part of the $i^{th}$ source packet). For example, if the $j^{th}$ symbol element does not include padding bytes, the information indicating the length of the effective information included in the $j^{th}$ symbol element may be omitted.

In an embodiment of the present disclosure, the symbol element header may include at least one of information indicating whether the $j^{th}$ symbol element includes a start portion of the $i^{th}$ source packet, information indicating whether the $j^{th}$ symbol element includes the last portion of the $i^{th}$ source packet, and information indicating the length of padding bytes included in the $j^{th}$ symbol element.

In another embodiment of the present disclosure, the symbol element header may include at least one of information indicating whether the $j^{th}$ symbol element includes a start portion of the $i^{th}$ source packet, information indicating whether the $j^{th}$ symbol element includes the last portion of the $i^{th}$ source packet, and information required for obtaining the length of padding bytes included in the $j^{th}$ symbol element, and the information indicating the length of padding bytes actually exists in a portion of the symbol element or in a separately designated specific position of the symbol element.

Figure 6:
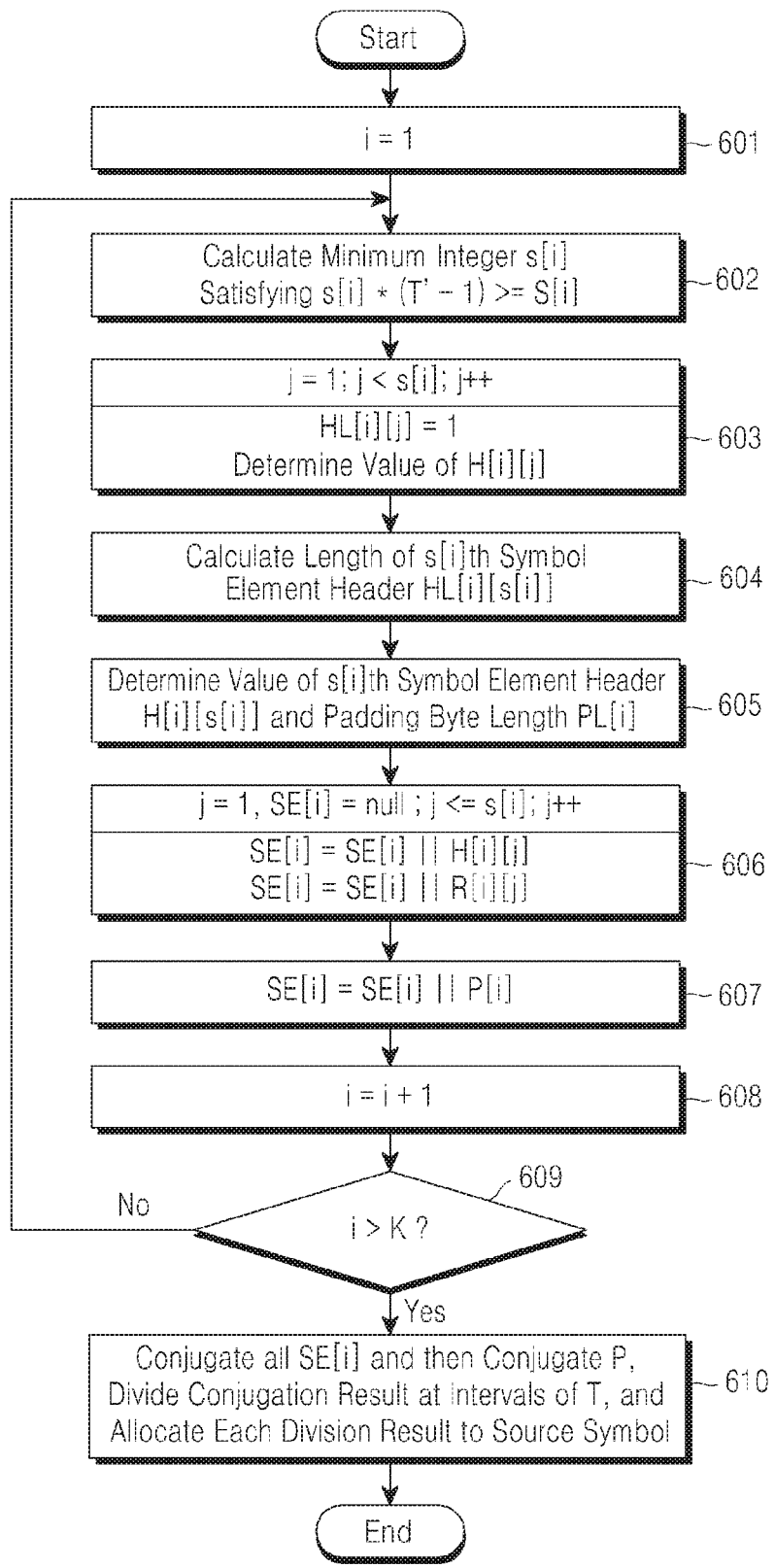
FIG. 6 is a flowchart illustrating generation of a source symbol block using ssbg_mode2 according to an embodiment of the present disclosure.

FIG. 6 is a flowchart illustrating a process in which a transmission device generates a source symbol block by using ssbg_mode2 according to an embodiment of the present disclosure.

Referring to FIG. 6, to describe a process of generating a source symbol block by using ssbg_mode2 based on the flowchart, symbols are defined as below.

K: the number of source packets included in a source packet block

K': the number of source symbols included in a source symbol block

R[i]: octets of an $i^{th}$ source packet included in a source packet block

S[i]: an octet-based length of R[i]

T: an octet-based length of a source symbol

N: the number of symbol elements of one source symbol

T': a length of a symbol element (T'=T/N)

s[i]: a minimum integer satisfying $s[i]*\{(T/N)-1\}=s[i]*(T'-1)>=S[i]$

R[i][j]: octets from $\{(j-1)*(T'-1)+1\}^{th}$ order to $\{min\{j*(T'-1), S[i]\}\}^{th}$ order of R[i]

H[i][j]: an octet representing a symbol element header of a $j^{th}$ symbol element to which an $i^{th}$ source packet is allocated (j=1, 2, . . . , s[i])

HL[i][j]: an octet-based length of H[i][j]

PL[i]: a length of padding bytes included in the last symbol element to which an $i^{th}$ source packet is allocated P[i]: PL[i] zero octets P: K'*T-sum $\{s[i]*T', i=1, 2, . . . , K\}$ zero octets SE[i]: octets of a symbol element (SE) including the entire $i^{th}$ source packet included in a source packet block or a part of the $i^{th}$ source packet The source symbol block generation process illustrated in FIG. 6 may immediately start after octets R[1] included in the first (i.e., i=1) source packet and a length S[1] of the first source packet are determined, in operation 601. A process of obtaining SE[i] is identical regardless of the value i, and thus will be described based on the $i^{th}$ source packet.

The first operation of obtaining SE[i] includes obtaining s[i] in operation 602, in which s[i] indicates the number of symbol elements to which the source packet is to be allocated.

The next operation includes obtaining a length of symbol elements included in a start portion of s[i] symbol elements and a value of the symbol elements in operations 603, 604, and 605. Operation 603 originates from a feature that there are no padding bytes in the remaining symbol elements except for the last $(s[i]^{th})$ symbol element. Operation 604 includes calculating the length HL[i][j] of the $s[i]^{th}$ symbol element header. The symbol element header H[i][s[i]] of the last symbol element includes information about the number of padding bytes included in the last symbol element, PL[i], and thus they may be calculated together in operation 605.

The transmission device conjugates the symbol element header H[i][j] with octets R[i][j] obtained by dividing R[i] at (T'-1)-byte intervals in an order of j=1, 2, . . . , s[i] in operation 606, and conjugates P[i] including PL zero octets in operation 607, thus configuring SE[i]. In operations 606 and 607 of FIG. 6, 'A∥B' means conjugating octets A with octets B.

After obtaining SE[i] by applying the foregoing operations to all the K source packets included in the source packet block in operations 608 and 609, the transmission device conjugates SE[i] in an order of i=1, 2, . . . , K, conjugates additional padding bytes P, and divides a final result at intervals of T, and sequentially allocates the divided one to a source symbol, thus generating the source symbol in operation 610. Although SE[i] is allocated to a separate memory in the foregoing description, this may vary with implementations, and an implementation scheme is not related to the subject matter of the present disclosure.

Hereinbelow, a detailed description will be made of operations 603, 604, and 605 of obtaining a length of symbol elements included in a start portion of s[i] symbol elements and a value of the symbol elements in the source symbol block generation process.

Figure 7:
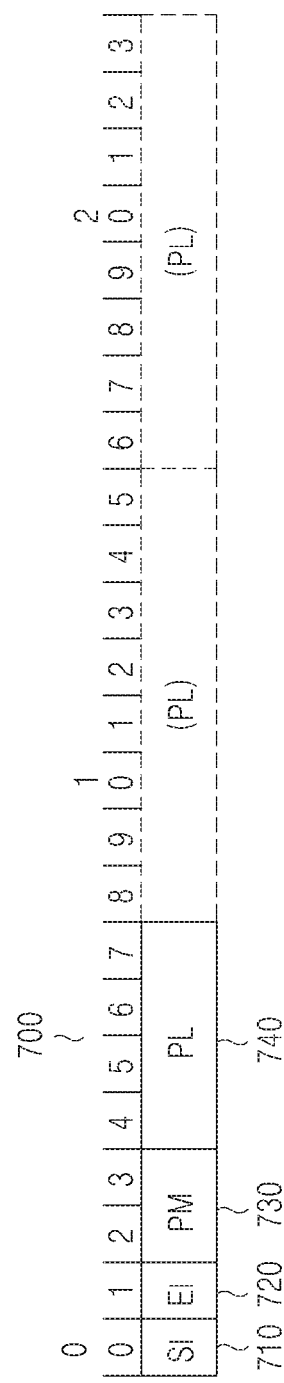
FIG. 7 shows a symbol element header H according to an embodiment of the present disclosure.

FIG. 7 illustrates a symbol element header H 700 according to an embodiment of the present disclosure.

Referring to FIG. 7, the symbol element header H 700 may include a start indicator (SI) 710 having an 1-bit length, an end indicator (EI) 720 having an 1-bit length, a padding mode (PM) 730 having a 2-bit length, and a PL 740 indicating the number of padding bytes included in a symbol element having a length that varies with the PM.

The SI 710 has a value of '1' if the symbol element including the symbol element header H 700 includes a start portion of the source packet; otherwise, the SI 710 has a value of '0'. The EI 720 has a value of '1' if the symbol element including the symbol element header H 700 includes the last portion of the source packet; otherwise, the EI 720 has a value of '0'. The PM 730 has a value of '00' if the length of the PL 740 is 4 bits, a value of '01' for the 12-bit length of the PL 740, a value of '10' for the 20-bit length of the PL 740, and a reserved value of '11'. The PL 740 whose length is determined based on the PM 730 indicates the number of padding bytes included in the symbol element including the symbol element header H 700.

When the symbol element header as shown in FIG. 7 is used, HL[i][j], H[i][j], and PL[i] may be determined as described below.

For convenience, it is assumed that the $i^{th}$ source packet is included in s[i] symbol elements. In this case, a length of octets R[i] [s[i]] of the source packet included in the last (s[i]th) symbol element is S[i]-(s[i]-1)*(T'-1) bytes. If the number of bytes that are available for padding in the last symbol element is PL_temp[i], PL_temp[i] is calculated as expressed in Equation 1.

$$PL\_temp[i]=(T'-1)-\{S[i]-(s[i]-1)*(T'-1)\}= s[i]*(T'-1)-S[i] \quad \text{Equation 1}$$

Based on PL_temp[i], field values of the PM 730 and the PL 700, and a value of PL[i] may be determined as below.

For 0<=PL_temp[i]<16, PM=00, PL=PL[i]=PL_temp[i]

For 16<=PL_temp[i]<4096, PM=01, PL=PL[i]=PL_temp[i]-1

For 4096<=PL_temp[i]<65534, PM=10, PL=PL[i]=PL_temp[i]-2

Figure 8:
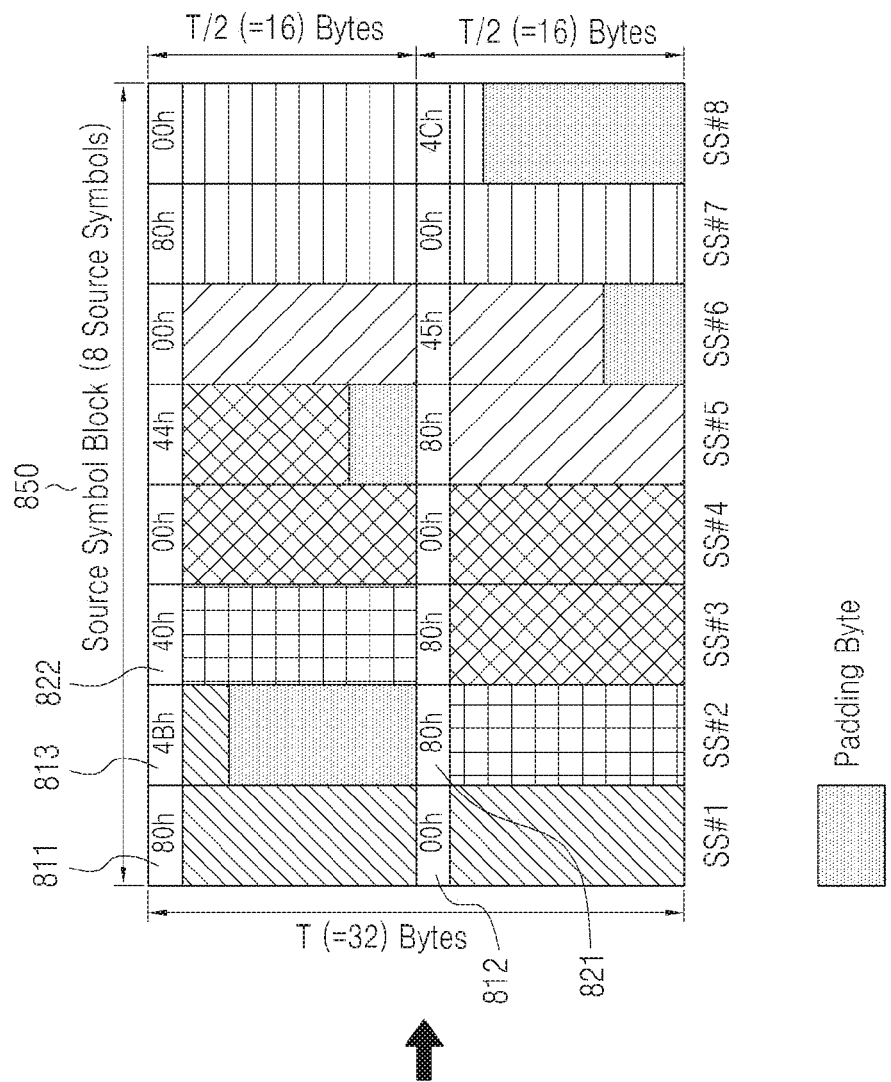
FIG. 8 shows an example of a source symbol block generated using ssbs_mode2 using a symbol element header according to an embodiment of the present disclosure.
Figure 8:
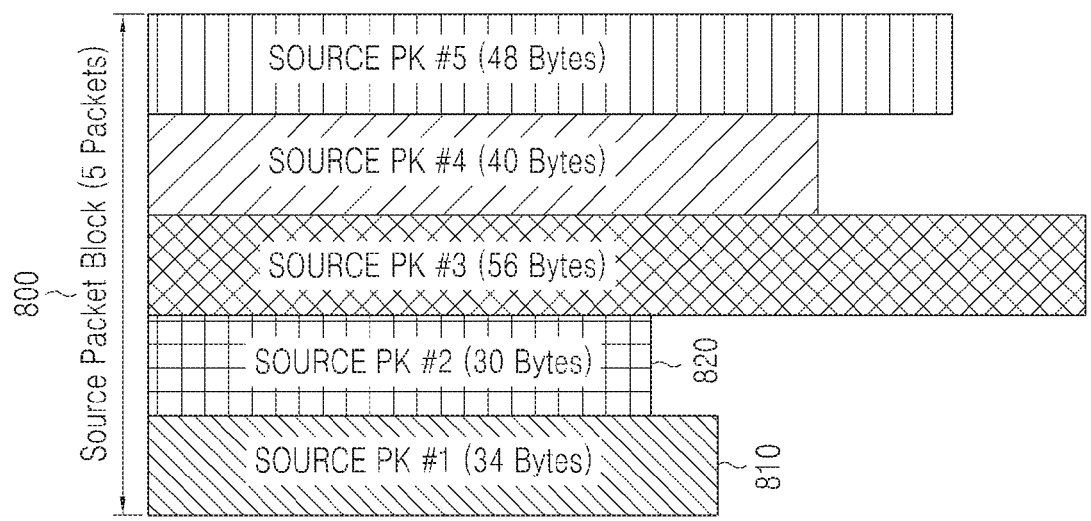

FIG. 8 illustrates an example of a source symbol block generated using ssbs_mode2 using the symbol element header shown in FIG. 2 according to an embodiment of the present disclosure.

Referring to FIG. 8, a region 860 filled with multiple points indicates padding bytes.

Referring to FIG. 8, a source packet block 800 including 5 source packets is converted into a source symbol block 850 including 8 source symbols. In the example of FIG. 8, a length of a source symbol, T, is equal to 32 bytes, and each source symbol includes two symbol elements having a length of T'=T/2=16 bytes.

A first source packet 810 of the source packet block has a length of 34 bytes (16+16+2), such that s[1]=3. The first source packet 810 is included in 3 symbol elements (that is, symbol elements including symbol element headers 811, 812, and 813, respectively). The header 811 of the first symbol element among the symbol elements has a value of 80h (='1000 0000') because only the SI 710 is '1' and the other bits are all 0, and the header 812 of the second symbol element among the symbol elements has a value of 00h (='0000 0000') because all bits are 0. When [Equation 1] is used to calculate the header 813 of the last symbol element among the symbol elements, PL_temp[1]=s[1]*(T−1)−S[1]=3*15−34=11. Thus, in the header 813 of the last symbol element among the symbol elements, SI='0', EI='1', PM='00', and PL=11, such that there is 11-byte padding, and the header 813 of the last symbol element among the symbol elements has a value of 4Bh (='0100 1011').

A second source packet 820 of the source packet block has a length of 30 bytes, such that s[1]=2. The second source packet 810 is included in 2 symbol elements (that is, symbol elements including symbol element headers 821 and 822, respectively). The header 821 of the first symbol element among the symbol elements has a value of 80h (='1000 0000') because only the SI 710 is '1' and the other bits are all 0. When [Equation 1] is used to calculate the header 822 of the second symbol element among the symbol elements, PL_temp[2]=s[2]*(T−1)−S[2]=2*15−30=0. Thus, in the header 813 of the last symbol element among the symbol elements, SI='0', EI='1', and PM='00', such that there is no padding byte, and the header 822 of the second symbol element among the symbol elements has a value of 40h (='0100 0000').

Figure 9:
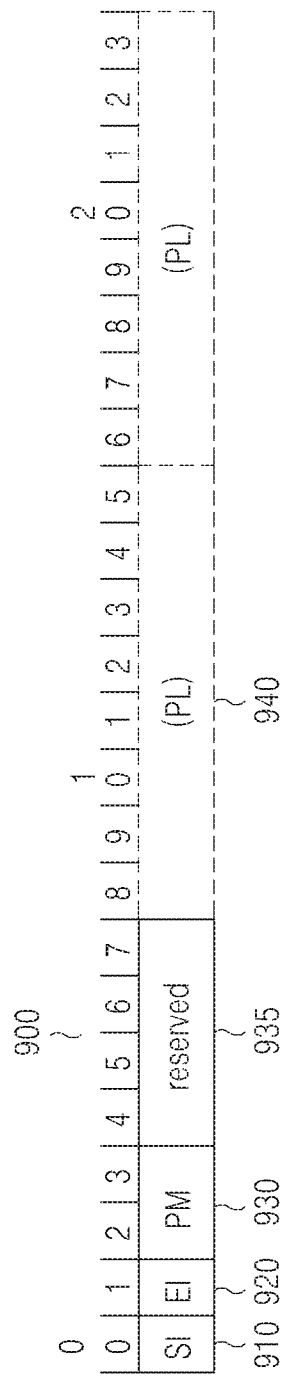
FIG. 9 illustrates a symbol element header H according to another embodiment of the present disclosure.

FIG. 9 illustrates a symbol element header H 900 according to another embodiment of the present disclosure.

Referring to FIG. 9, the symbol element header H 900 may include an SI 910 having a 1-bit length, an EI 920 having a 1-bit length, a PM 930 having a 2-bit length, and a PL 940 indicating the number of padding bytes included in a symbol element having a length that varies with the PM.

The SI 910 has a value of '1' if the symbol element including the symbol element header H 900 includes a start portion of the source packet; otherwise, the SI 910 has a value of '0'. The EI 920 has a value of '1' if the symbol element including the symbol element header H 900 includes the last portion of the source packet; otherwise, the EI 920 has a value of '0'. The PM 930 has a value of '00' if the symbol element does not include any padding bytes, has a value of '01' if the length of the PL 940 is 1 byte, has a value of '10' if the length of the PL 840 is 2 bytes, and has a reserved value of '11'. The 4 bits 935 following the PM 930 are reserved (=0h). The PL 940 whose length is determined based on the PM 930 indicates the number of padding bytes included in the symbol element including the symbol element header H 900. If the value of the PM is '00', the PL 940 does not exist anymore.

When the symbol element header as shown in FIG. 9 is used, HL[i][j], H[i][j], and PL[i] may be determined as described below. For convenience, it is assumed that the $i^{th}$ source packet is included in s[i] symbol elements. In this case, a length of octets R[i] [s[i]] of the source packet included in the last ($s[i]^{th}$) symbol element is S[i]−(s[i]−1)*(T−1) bytes. If the number of bytes that are available for padding in the last symbol element is PL_temp[i], PL_temp[i] is calculated as expressed in [Equation 1].

Based on PL_temp[i], field values of the PM 930 and the PL 900, and a value of PL[i] may be determined as below.

For PL_temp[i]==0, PM='00' and PL does not exist. PL[i]=0

For 0<PL_temp[i]<=256, PM='01', PL=PL[i]=PL_temp[i]−1

For 256<PL_temp[i]<65534, PM='10', PL=PL[i]=PL_temp[i]−2

In case of symbol element headers described in various embodiments of the present disclosure, the number of bits for representing the PL has been designed variably, but it is obvious that according to implementation, the number of bits for representing the PL may be fixed to a specific value, and in this case, the PM may be omitted or 1-bit information may be used as a field indicating existence or absence of the PL field (existence or absence of padding).

Figure 10:
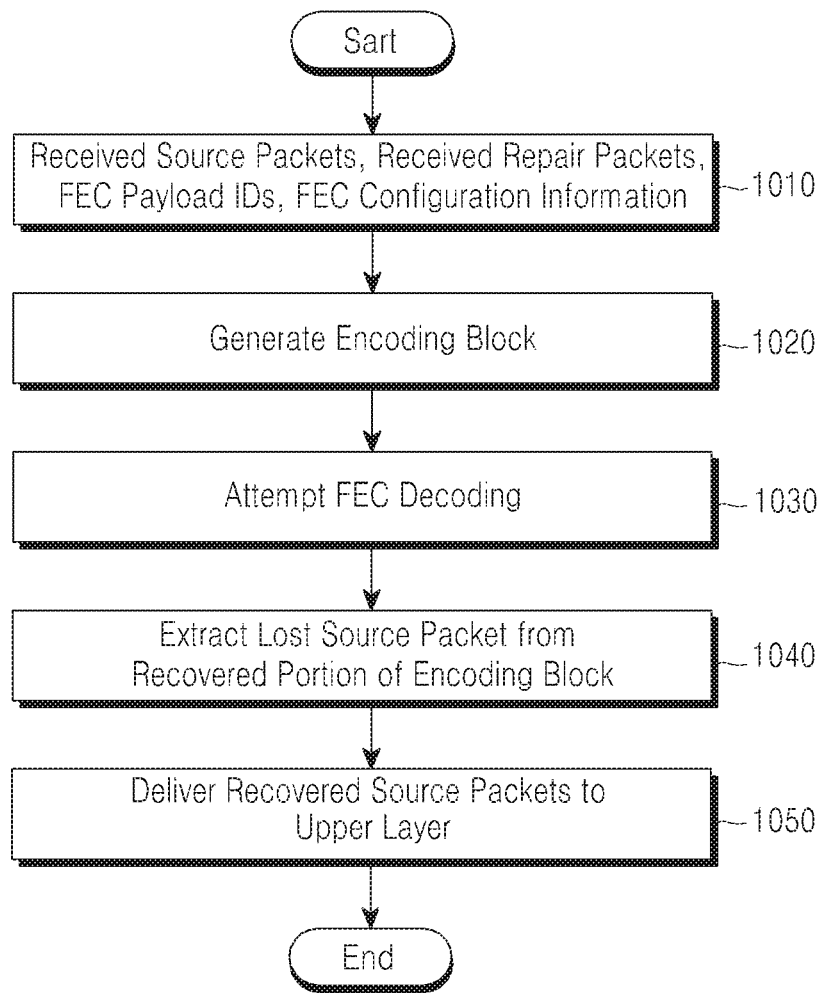
FIG. 10 is a flowchart illustrating an operation of an FEC decoding block according to an embodiment of the present disclosure.

FIG. 10 is a flowchart illustrating operations of the FEC decoding block 113 of a reception device according to an embodiment of the present disclosure.

Referring to FIG. 10, the FEC decoding block 113 starts decoding by using FEC configuration information, a received source packet, a received repair packet, and an FEC payload ID in operation 1010.

As described above, the FEC decoding block 113 generates an encoding block because of being capable of specifying a source symbol block including the received packet and source symbols included in the source symbol block, if using the FEC payload ID of the received packet, in operation 1020. A source symbol and a repair symbol corresponding to non-received source and repair packets are processed as being lost.

The FEC decoding block 113 attempts decoding of an FEC code by using the generated encoding block to generate a recovered encoding block in operation 1030. Thereafter, the FEC decoding block 113 extracts a source packet lost in a recovered portion (i.e., the recovered encoding block) of the encoding block in operation 1040, and the FEC decoding block 113 delivers the recovered source packet to an upper layer in operation 1050 and stops operations.

To extract the lost source packet from the recovered portion of the encoding block in operation 1040, a start point of a packet has to be found in a recovered source symbol or symbol element and padding bytes have to be erased. When the source block generation method 'ssbg_mode0' is used, there is no padding byte; when the source block generation method 'ssbg_mode1' is used, length information of the source packet included in the recovered source symbol exists in the start portion of the recovered source symbol, such that a process of extracting the source packet from the source symbol is apparent. When the source block generation method 'ssbg_mode2' is used, the recovered source symbol element may not include the start point of the source packet, such that several processes are required.

Figure 11:
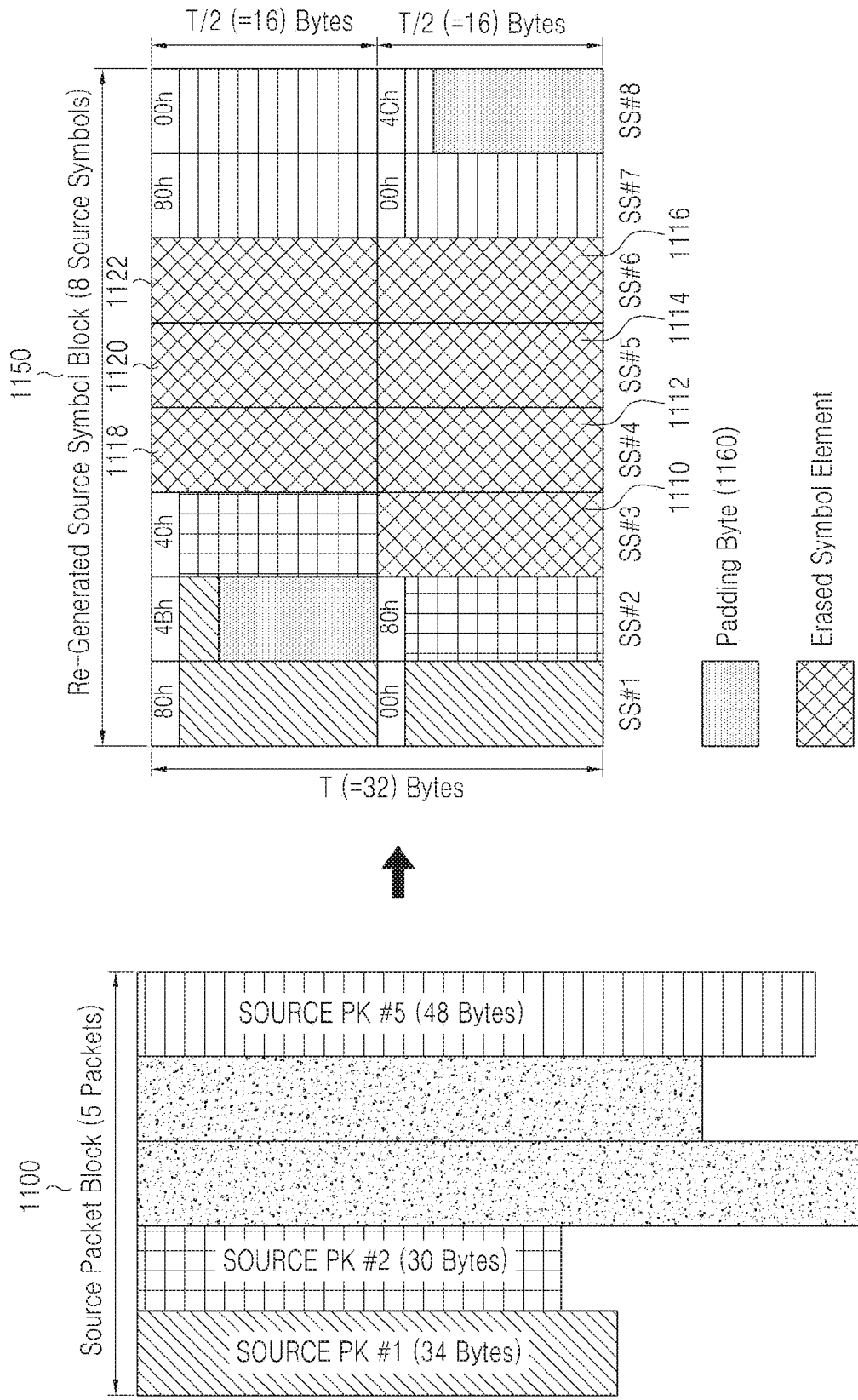
FIG. 11 illustrates a received source symbol block re-generated for decoding in a receiver when ssbg_mode2 is used according to an embodiment of the present disclosure.

FIG. 11 illustrates a received source symbol block re-generated for decoding by a receiver when the source block generation method ssbg_mode2 is used according to an embodiment of the present disclosure.

Referring to FIG. 11, a region 1160 filled with multiple points indicates padding bytes, and a region 1170 marked with bidirectional diagonal lines indicates erased symbol elements.

FIG. 11 shows an example in which the third source packet and the fourth source packet fail to be received in the source packet 1100 including 5 source, which are similar to the 5 source packets shown in FIG. 8. For FEC decoding, a received encoding block including a parity symbol has to be re-generated, but the re-generated received encoding block is a simple combination of the re-generated received source symbol block 1150 and the re-generated received repair symbol block (not shown), such that for convenience of a description, only the re-generated received source symbol 1150 is shown. Symbol elements corresponding to the received source packet are re-generated identically to the source symbol block 850 configured by the transmitter by using the FEC payload ID and the FEC configuration information. It can be seen from FIG. 11 that the re-generated received source symbol block 1150 includes 7 lost symbol elements 1110, 1112, 1114, 1116, 1118, 1120, and 1122.

Figure 12:
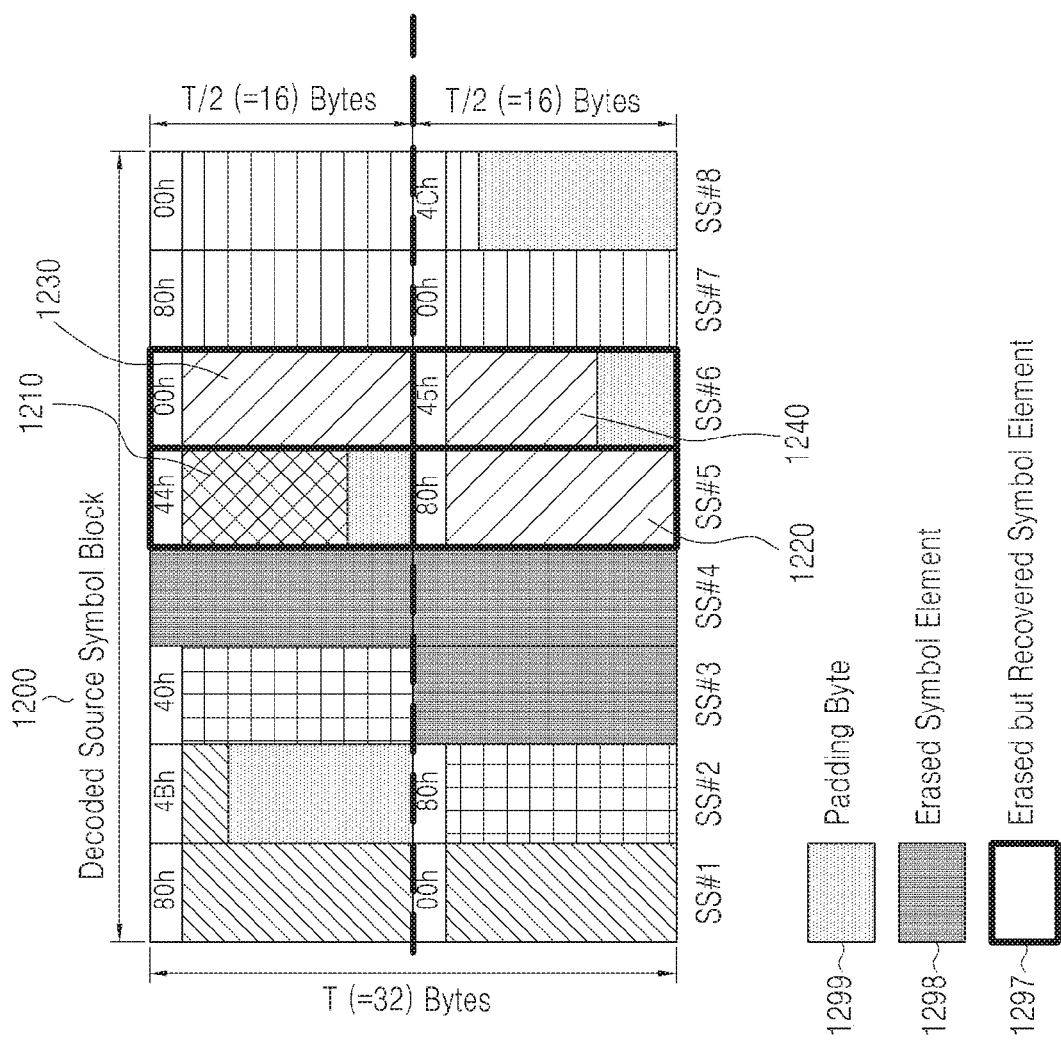
FIG. 12 illustrates a source symbol block after FEC decoding is performed according an embodiment of the present disclosure.

FIG. 12 illustrates a source symbol block after a reception device performs FEC decoding according to an embodiment of the present disclosure.

Referring to FIG. 12, a region (e.g., 1299) filled with multiple points indicates padding bytes, a marked region indicated by 1298 indicates erased symbol elements, and a region (e.g., 1297) having outer lines that are thick solid lines indicates erased, but recovered symbol elements.

When compared to in the re-generated received source symbol block 1120 of FIG. 11, in a decoded source symbol block 1200 of FIG. 12, 4 symbol elements 1210, 1220, 1230, and 1240 are recovered.

Once a symbol element header 44h of the first symbol element 1210 among the recovered symbol elements is interpreted, the symbol element 1210 includes a last portion of a source packet, such that a complete packet may not be extracted from the symbol element 1210.

Once a symbol element header 80h of the second symbol element 1220 among the recovered symbol elements is interpreted, the symbol element 1220 includes a start portion of a source packet.

Next, if a symbol element header 00h of the third symbol element 1230 among the recovered symbol elements is interpreted, the symbol element 1230 includes a middle portion of the source packet, and if a symbol element header 45h of the fourth symbol element 1240 among the recovered symbol elements is interpreted, the symbol element 1240 includes the last portion of a source packet and 5-byte padding bytes.

Thus, a symbol element header is removed from each of the 3 recovered symbol elements 1220, 1230, and 1240 and the last padding byte is removed therefrom, and then they are connected, such that the lost fourth source packet is extracted.

A condition for a successful source packet extraction process is as described below. It is assumed that N continuous symbol elements RSE[i], RSE[i+1], . . . , RSE[i+N] are recovered as a result of FEC decoding. If RSE[i+a] is a symbol element that first includes a start portion of a packet (SI='1') as a result of interpreting a header of the recovered symbol elements, its preceding RSE[i], RSE[i+1], . . . , RSE[i+a−1] are not used for extraction of a complete source packet. If RSE[i+b] is a symbol element that last includes a start portion of a packet (SI='1') and there is no symbol element including a last portion of the packet (EI='1') among RSE[i+b], RSE[i+b+1], . . . , RES[i+N], then RSE [i+b], RSE[i+b+1], . . . , RES[i+N] are not used for extraction of a complete source packet. Thus, only RSE[i+a], RSE[i+a+1], . . . , RSE[i+b−1] are used for extraction of a recovered source packet, and the number of recovered source packets is equal to the number of symbol elements having a header set to SI='1' among RSE[i+a], RSE[i+a+1], . . . , RSE[i+b−1].

Figure 13:
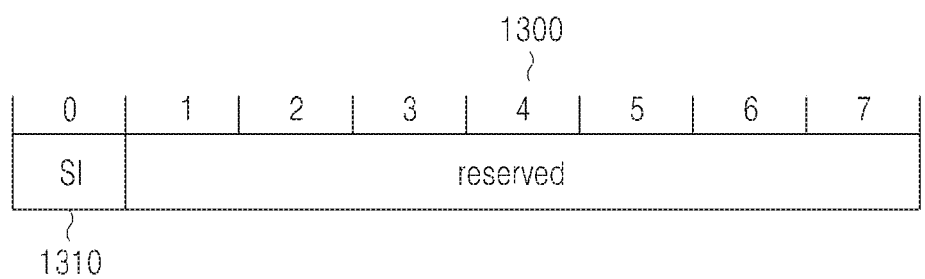
FIG. 13 illustrates a symbol element header when a field indicating a length of a source packet exists in a header of the source packet according to an embodiment of the present disclosure.

FIG. 13 illustrates a symbol element header H 1300 if there is a field indicating a length of a source packet in a header of the source packet according to an embodiment of the present disclosure.

Referring to FIG. 13, the symbol element header 1300 includes an SI 1310 having a 1-bit length and the remaining 7 bits are reserved. The SI 1310 has a value of '1' if the symbol element including the symbol element header H 1300 includes a start portion of the source packet; otherwise, the SI 1310 has a value of '0'.

The use of the symbol element header 1300 shown in the embodiment of FIG. 13 is not limited to a case where a field indicating a length of the source packet exists in the header of the source packet, but may also be applied to a case where the length of the source packet may be known using another method. For example, the case may be a case where information indicating the length of the source packet is positioned in a particular position of a symbol element including the source packet or next octets of the symbol element header 1300, or a reserved region of the symbol element header and its following octets.

Figure 14:
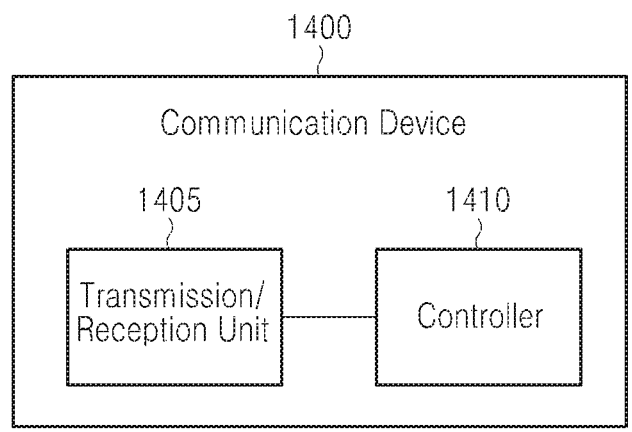
FIG. 14 is a diagram illustrating a structure of a communication device according to an embodiment the present disclosure.

FIG. 14 is a diagram illustrating a structure of a communication device according to an embodiment of the present disclosure.

Referring to FIG. 14, a communication device 1400 may be a transmission device or a reception device described in the present disclosure. The communication device 1400 may include a transmission/reception unit 1405 for transmission/reception of data and a signal to and from another communication device through the transmission channel 120, and a controller 1410 for controlling all operations of the communication device 1400.

The controller 1410 may be understood as including all components (e.g., various blocks) of the transmission device or the reception device described in the present disclosure. For example, in the transmission device, the protocol A block 101, the FEC encoding block 102, the protocol B block 103, and the transmitter physical layer block 104 of FIG. 1 may be implemented by the controller 1410. In another example, in the reception device, the protocol A block 114, the FEC decoding block 113, the protocol B block 112, and the receiver physical layer block 111 of FIG. 1 may be implemented by the controller 1410. In another example, in the transmission device, the MMT application 210, the MMT protocol 220, the MMT FEC scheme 230, the FEC code 240, the transmission layer 250, and the IP 260 of FIG. 2 may be implemented by the controller 1410. The controller 1210 may be implemented by a processor together with a memory unit for storing instructions.

While various embodiments of the present disclosure have been described, various changes may be made without departing the scope of the present disclosure. Therefore, the scope of the present disclosure should be defined by the appended claims and equivalents thereof, rather than by the described embodiments.

It will be understood that each block of the flowchart and/or block diagram illustrations, and combinations of blocks in the flowchart and/or block diagram illustrations, may be implemented by computer program instructions. These computer program instructions may also be stored in a general-purpose computer, a special-purpose computer, or a processor of other programmable data processing devices, such that the instructions implemented the computer or the processor of the programmable data processing device produce a means for performing functions specified in the flowchart and/or block diagram block or blocks. These computer program instructions may also be stored in a nontransitory computer usable or nontransitory computer-readable memory that may direct a computer or other programmable data processing apparatus to function in a particular manner, such that the instructions stored in the nontransitory computer usable or nontransitory computer-readable memory produce an article of manufacture including instructions that implement the function specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the functions specified in the flowchart and/or block diagram block or blocks.

In addition, each block represents a module, segment, or portion of code, which includes one or more executable instructions for implementing the specified logical function(s). It should also be noted that in other implementations, the function(s) noted in the blocks may occur out of the order. For example, two blocks shown in succession may, in fact, be executed substantially concurrently or the blocks may sometimes be executed in the reverse order, depending on the functionality involved.

In various embodiments of the present disclosure, the term "unit", as used herein, denotes a software or hardware component, such as a field programmable gate array (FPGA) or application specific integrated circuit (ASIC), which performs certain tasks. However, the meaning of "unit" is not limited to software or hardware. "unit" may advantageously be configured to reside on the addressable storage medium and configured to reproduce one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "units" may be combined into fewer components and "units" or further separated into additional components and "units". In addition, components and 'unit(s)' may be implemented to execute one or more central processing units (CPUs) in a device or a secure multimedia card.

Those of ordinary skill in the art to which the present disclosure pertains will appreciate that the present disclosure may be implemented in different detailed ways without departing from the technical spirit or essential characteristics of the present disclosure. Accordingly, the aforementioned embodiments should be construed as being only illustrative, but should not be constructed as being restrictive from all aspects. The scope of the present disclosure is defined by the following claims rather than the detailed description, and the meanings and scope of the claims and all changes or modified forms derived from their equivalents should be construed as falling within the scope of the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. A method for transmitting a packet by a signal transmission device in a communication system, the method comprising:
    generating a source symbol block comprising one or more source symbols having an identical length by using a source packet block comprising one or more source packets;
    generating a repair symbol block comprising one or more repair symbol blocks by performing forward error correction (FEC) encoding with respect to the source symbol block;
    generating an FEC source packet comprising the source packets and a source FEC payload identifier (ID) and delivering the FEC source packet to a lower protocol;
    generating an FEC repair packet comprising the one or more repair symbols and a repair FEC payload ID and delivering the FEC repair packet to the lower protocol; and
    delivering FEC configuration information comprising information about the generation of the source symbol block to a receiver,
    wherein one source symbol comprises one or more symbol elements,
    wherein a symbol element comprises a symbol element header and an entire source packet or a part thereof, and
    wherein the symbol element header comprises at least one of information indicating whether the symbol element comprises a start portion of a source packet, information indicating whether the symbol element comprises a last portion of the source packet, and information indicating a length of padding bytes included in the symbol element.

2. The method of claim 1, wherein, when one source packet is mapped to one source symbol in the generation of the source symbol block, the source symbol comprises the source packet and information indicating a length of the source packet.

3. The method of claim 2, wherein any one of the source symbol and the symbol element further comprises padding bytes.

4. The method of claim 1, wherein a header of the source packet comprises information indicating a length of the source packet.

5. A signal transmission device for transmitting a packet in a communication system, the signal transmission device comprising:
    a source symbol block generator configured to generate a source symbol block comprising one or more source symbols having an identical length by using a source packet block comprising one or more source packets;
    a forward error correction (FEC) encoder configured to generate a repair symbol block comprising one or more repair symbol blocks by performing FEC encoding with respect to the source symbol block;
    an FEC packet generator configured to deliver an FEC source packet comprising the source packets and a source FEC payload identifier (ID) to a lower protocol and to generate an FEC repair packet comprising the one or more repair symbols and a repair FEC payload ID and deliver the FEC repair packet to the lower protocol; and
    an FEC signal delivering unit configured to deliver FEC configuration information comprising information about the generation of the source symbol block to a receiver,
    wherein the source symbol block generator configures one source symbol with one or more symbol elements,
    wherein a symbol element comprises a symbol element header and an entire source packet or a part thereof, and
    wherein the symbol element header comprises at least one of information indicating whether the symbol element comprises a start portion of a source packet, information indicating whether the symbol element comprises a last portion of the source packet, and information indicating a length of padding bytes included in the symbol element.

6. The signal transmission device of claim 5, wherein, when one source packet is mapped to one source symbol in the source symbol block generator, the source symbol comprises the source packet and information indicating a length of the source packet.

7. The signal transmission device of claim 6, wherein any one of the source symbol and the symbol element further comprises padding bytes.

8. The signal transmission device of claim 5, wherein a header of the source packet comprises information indicating a length of the source packet.

9. A method for receiving a packet by a signal reception device in a communication system, the method comprising:
receiving a signal from a transmitter and demodulating a packet;
selecting a packet comprising forward error correction (FEC) configuration information from the received packet and obtaining the FEC configuration information;
obtaining a source packet and a source FEC payload identifier (ID) from an FEC source packet of the received packet;
obtaining a repair symbol and a repair FEC payload ID from an FEC repair packet of the received packet;
generating a received encoding block comprising a received source symbol block by using the obtained source packet, the obtained repair symbol, the obtained source FEC payload ID, the obtained repair FEC payload ID, and the obtained FEC configuration information;
generating a recovered encoding block by applying FEC decoding to the received encoding block;
extracting a source packet from a recovered source symbol of the recovered encoding block; and
delivering the extracted source packet to an upper protocol,
wherein the extraction of the source packet comprises determining whether a recovered symbol element comprises a start portion of a lost source packet, whether the recovered symbol element comprises a last portion of the lost source packet, and the number of padding bytes included in the recovered symbol element, by using information included in the recovered symbol element in the extraction of the source packet, and erasing padding bytes from one or more recovered symbol elements by using a result of the determination and extracting source packets included in the recovered symbol element.

10. The method of claim 9, wherein, when one source packet is mapped to one source symbol, the source symbol comprises the source packet and information indicating a length of the source packet.

11. The method of claim 9, wherein one source symbol comprises one or more symbol elements,
wherein a symbol element comprises a symbol element header and an entire source packet or a part thereof, and
wherein the symbol element header comprises information indicating whether the symbol element comprises a start portion of a source packet, information indicating whether the symbol element comprises a last portion of the source packet, and information indicating a length of padding bytes included in the symbol element.

12. A signal reception device for receiving a packet in a communication system, the signal reception device comprising:
a demodulator configured to receive a signal from a transmitter and to demodulate a packet;
a forward error correction (FEC) configuration information obtaining unit configured to select a packet comprising FEC configuration information from the received packet and to obtain the FEC configuration information;
an FEC packet receiver configured to obtain a source packet and a source FEC payload identifier (ID) from an FEC source packet of the received packet and to obtain a repair symbol and a repair FEC payload ID from an FEC repair packet of the received packet;
a received encoding block generator configured to generate a received encoding block comprising a received source symbol block by using the obtained source packet, the obtained repair symbol, the obtained source FEC payload ID, the obtained repair FEC payload ID, and the obtained FEC configuration information;
an FEC decoder configured to generate a recovered encoding block by applying FEC decoding to the received encoding block;
a repair packet extractor configured to extract a source packet from a recovered source symbol of the recovered encoding block; and
a packet delivering unit configured to deliver the extracted source packet to an upper protocol, wherein the repair packet extractor determines whether a recovered symbol element comprises a start portion of a lost source packet, whether the recovered symbol element comprises a last portion of the lost source packet, and the number of padding bytes included in the recovered symbol element, by using information included in the recovered symbol element in the extraction of the source packet, and erases padding bytes from one or more recovered symbol elements by using a result of the determination and extracts source packets included in the recovered symbol element.

13. The signal reception device of claim 12, wherein, when one source packet is mapped to one source symbol, the source symbol comprises the source packet and information indicating a length of the source packet.

* * * * *